United States Patent … (10) Patent No.: US 7,830,073 B2
Sakashita et al. … (45) Date of Patent: Nov. 9, 2010

(54) PEROVSKITE OXIDE, ELECTRIC ELEMENT, PIEZOELECTRIC ACTUATOR AND LIQUID DISCHARGE SYSTEM

(75) Inventors: Yukio Sakashita, Kanagawa-ken (JP); Takamichi Fujii, Kanagawa-ken (JP); Yuuichi Okamoto, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 573 days.

(21) Appl. No.: 11/802,705

(22) Filed: May 24, 2007

(65) Prior Publication Data
US 2007/0287030 A1 Dec. 13, 2007

(30) Foreign Application Priority Data
May 25, 2006 (JP) ............................. 2006-144903

(51) Int. Cl.
*H01L 41/24* (2006.01)
(52) U.S. Cl. ..................... 310/358; 257/347; 501/134
(58) Field of Classification Search ................. 310/358; 257/347; 501/134
See application file for complete search history.

(56) References Cited

U.S. PATENT DOCUMENTS

| | | | |
|---|---|---|---|
| 5,986,301 A * | 11/1999 | Fukushima et al. | 257/306 |
| 6,042,806 A * | 3/2000 | Bedard | 423/594.3 |
| 7,196,457 B2 | 3/2007 | Miyazawa et al. | |
| 2002/0053546 A1* | 5/2002 | Bedard | 210/660 |
| 2005/0146249 A1* | 7/2005 | Miyazawa et al. | 310/358 |
| 2006/0154801 A1* | 7/2006 | Lee et al. | 501/108 |
| 2006/0222872 A1* | 10/2006 | Higuchi et al. | 428/469 |

OTHER PUBLICATIONS

Kishi et al., "Effect of Re-oxidation on Dielectric Properties of Rare-earth and V-doped $BaTiO_3$", The 11th US-Japan Seminar on Dielectric & Piezoelectric Ceramics, pp. 35-38, 2003.
M. Pereira et al., "Effect of Nb doping on the microstructural and electrical properties of the PZT ceramics", J. Eur. Ceram. Soc. vol. 21, Issues 10-11, pp. 1353-1356, 2001.

* cited by examiner

*Primary Examiner*—Walter Benson
*Assistant Examiner*—Bryan P Gordon
(74) *Attorney, Agent, or Firm*—Birch, Stewart, Kolasch & Birch, LLP

(57) ABSTRACT

A perovskite oxide is represented by a general formula $ABO_3$ A represents at least one kind of metal element forming an A site, B represents at least one kind of metal element forming a B site. The B site includes at least one kind of metal element B1 selected from an element group consisting of the IV group elements and at least one kind of metal element B2 selected from an element group consisting of the V and VI group elements, and at least a part of the metal element B2 is of the 0 to +4 valence.

15 Claims, 4 Drawing Sheets

INTRINSIC PZT

JAPANESE UNEXAMINED
PATENT PUBLICATION
NO. 2005-150694

PRESENT INVENTION

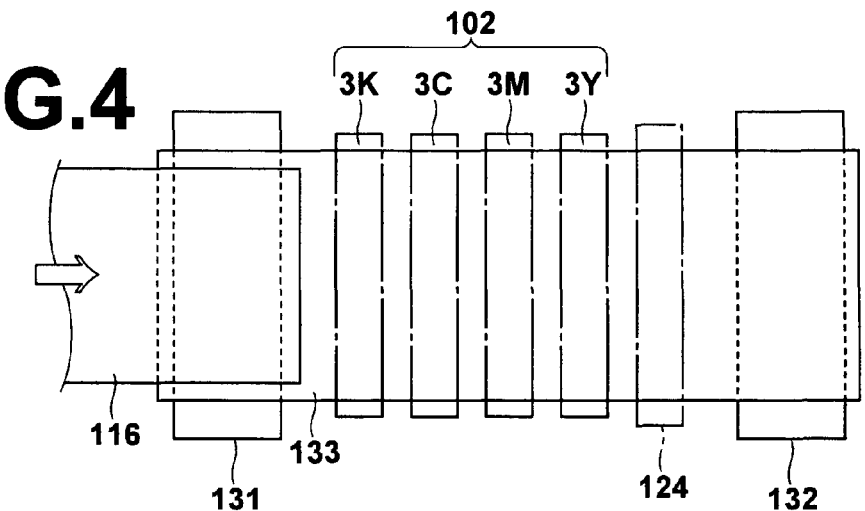
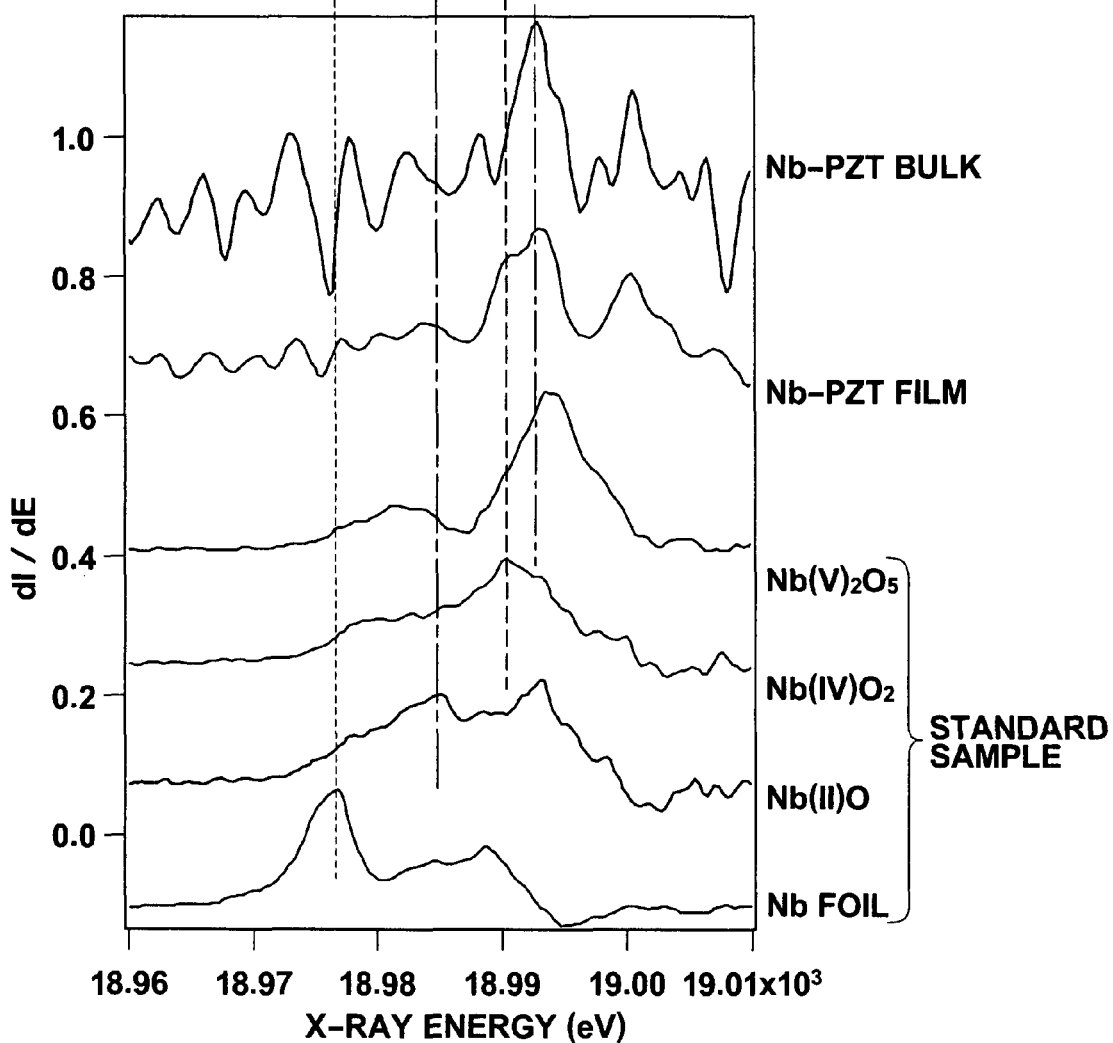

PEROVSKITE OXIDE, ELECTRIC ELEMENT, PIEZOELECTRIC ACTUATOR AND LIQUID DISCHARGE SYSTEM

BACKGROUND OF THE INVENTION

1. Field of the Invention

This invention relates to a perovskite oxide; an inorganic composition or an inorganic molded body or inorganic film containing therein the perovskite oxide; a ferroelectric element using a perovskite oxide; and a piezoelectric actuator or a liquid discharge system using a ferroelectric element.

2. Description of the Related Art

There has been used in various applications such as the piezoelectric actuator for an inkjet recording head a piezoelectric actuator comprising piezoelectric film having piezoelectricity where it is expanded and contracted according to the intensity of an applied electric field and an electrode for applying an electric field to the piezoelectric film. As a piezoelectric material, a perovskite oxide having a ferroelectricity such as zircon titanate (PZT) has been wide used.

While electronic devices have been miniaturized, light-weighted and provided with various functions, there is a tendency to make the piezoelectric element mounted thereon miniaturized, light-weighted and provided with various functions. For example, in the inkjet recording head, to increase the density of the piezoelectric elements has been investigated in order to improve the image quality and to reduce the thickness of each piezoelectric element in response thereto has been investigated. Accordingly, piezoelectric film exhibiting a high piezoelectricity even its thickness is small becomes necessary.

That the piezoelectric film exhibits a high piezoelectricity in the vicinity of a phase border is known and, for instance, in PZT, Zr and Ti are used in a molar ratio of 52/48 equal to that in the vicinity of a phase border. However, in the thin type piezoelectric film applications, a higher performance piezoelectric material becomes necessary.

As a means for improving the piezoelectricity, there has been proposed to dope the B site of PZT with an V or VI group element. For example, in U.S. Pat. No. 7,196,457, there is disclosed piezoelectric film having a composition represented by the following formula.

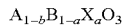

$A_{1-b}B_{1-a}X_aO_3$ wherein A represents at least one kind of element including Pb, B represents Zr and/or Ti, X represents at least one kind of element of V, Nb, Ta, Cr, Mo and W, $0.05 \leq a \leq 0.3$, and $0.25 \leq b \leq 0.15$.

In U.S. Pat. No. 7,196,457, there is disclosed that Pb in the A site is apt to evaporate to generate A site defect since the vapor pressure of Pb is high in PZT and when Pb is dislocated from the A site, oxygen loss is simultaneously generated on the basis of the law of charge neutrality (this defect is referred to as "Schottoky defect"), and when oxygen loss is generated, the band gap of PZT lowers and the insulation lowers whereby current leak is apt to be generated. Further, there is disclosed that, in the piezoelectric film of U.S. Pat. No. 7,196,457, when B site is doped with +5- or +6-valence element, oxygen loss is not generated even if Pb loss is generated, whereby charge neutrality can be held and current leak can be suppressed.

In the above formula, the number of moles of the A site element is represented by "1-b", and "b" represents Pb loss. That is, the invention disclosed in U.S. Pat. No. 7,196,457, that Pb loss is generated is assumed and oxygen loss is suppressed from being generated simultaneously with generation of Pb loss by doping an element having a valence larger than +4 to the B site which is originally +4 in its valence.

In U.S. Pat. No. 7,196,457, piezoelectric film 200 pm/V (=−200 pC/N) in piezoelectric constant ($d_{31}$) is obtained. The doping amount of X which is at least one kind of V group and/or VI group elements is 5 to 30 moles.

In "Effect of Nb doping on the microstructural and electrical properties of the PZT ceramics", M. Pereira et al., J. Eur. Ceram. Soc. Vol. 21, Issues 10-11, pp. 1353-1356, 2001, there is disclosed that up to about 7 mol % of Nb can be doped to PZT by solid solution in bulk ceramics, and when Nb is doped in about 2 mol %, the piezoelectric constant is maximized. Generally, the limit of solid solution can be obtained by the relation with the ionic radius or the like.

Inventors of U.S. Pat. No. 7,196,457 has described in the academic society that since the crystallization temperature is increased when doped with Nb, it is necessary to increase the firing temperature and when the firing temperature is increased, there arises a problem that Pb is dislocated and accordingly, the limit of solid solution is as disclosed in "Effect of Nb doping on the microstructural and electrical properties of the PZT ceramics", M. Pereira et al., J. Eur. Ceram. Soc. Vol. 21, Issues 10-11, pp. 1353-1356, 2001 in the normal method irrespective of whether the PZT is of bulk or of film. The inventors insist that the firing temperature can be lowered by adding Si as a firing assistant, whereby dislocation of Pb is suppressed and Nb can be doped in a high concentration.

It has been described above that generation of Pb loss is assumed and oxygen loss is suppressed from being generated simultaneously with generation of Pb loss by doping an element having a valence larger than +4 to the B site which is originally +4 in its valence, in the invention disclosed in U.S. Pat. No. 7,196,457. In other words, in the invention disclosed in U.S. Pat. No. 7,196,457, cation defect is necessarily generated in the A site on the basis of the law of charge neutrality since the B site is doped with an element having a valence larger than +4. The cation defect is not preferred in that it can lead to deterioration of ferroelectric performance (piezoelectric performance) and the like.

SUMMARY OF THE INVENTION

In view of the foregoing observations and description, the object of the present invention is to provide a novel concept of designing a perovskite oxide suitable for ferroelectric (piezoelectric) material or the like and a perovskite oxide having a novel composition designed on the basis of the concept.

Another object of the present invention is to provide a perovskite oxide which is suppressed in cation defect and excellent in ferroelectric (piezoelectric) performance.

In this specification, both a perovskite oxide of a single component and a composite perovskite oxide of multiple components will be simply referred to as "perovskite oxide".

In accordance with the present invention, there is provided a perovskite oxide represented by a general formula $ABO_3$ (in the formula, A represents at least one kind of metal element forming an A site, B represents at least one kind of metal element forming a B site, O represents an oxygen atom and the number of moles of elements of each of the A and B cites may deviate from 1.0 in the range where perovskite structure is held though the number of moles of elements of each of the A and B cites is 1.0 by standard.)

wherein the improvement comprises that the B site includes at least one kind of metal element B1 selected from an element group consisting of the IV group elements and at least one kind of metal element B2 selected from an element group consisting of the V and VI group elements, and at least a part of the metal element B2 is of the 0 to +4 valence.

In accordance with the present invention, there is further provided an inorganic composition or an inorganic molded body or inorganic film containing therein the perovskite oxide of the above-said present invention.

In accordance with the present invention, there is further provided a ferroelectric element comprising ferroelectric film including therein the perovskite oxide of the above-said present invention and an electrode for applying an electric field to the ferroelectric film. As the ferroelectric element, a piezoelectric element, a ferroelectric memory (FRAM) or the like may be shown.

In accordance with the present invention, there is further provided with a piezoelectric actuator comprising piezoelectric film including a perovskite oxide of the present invention having ferroelectricity, an electrode for applying an electric field to the piezoelectric film, and a vibrating plate which vibrates according to expansion and contraction of the piezoelectric film.

In accordance with the present invention, there is further provided with a liquid discharge system comprising the piezoelectric actuator and a liquid storing/discharging member comprising a liquid storing chamber in which liquid is stored and a liquid discharge port through which the liquid is externally discharged.

In accordance with the present invention, there can be provided a perovskite oxide which is suppressed in cation defect and excellent in ferroelectric (piezoelectric) performance.

BRIEF DESCRIPTION OF THE DRAWINGS

FIG. 4 is a block diagram showing a part of the ink jet recording system shown in FIG. 3, and FIG. 5 shows XANES spectra of the normal Nb-PZT bulk firing body and embodiment 1.

DESCRIPTION OF THE PREFERRED EMBODIMENT

Perovskite Oxide

A perovskite oxide in accordance with the present invention is represented by a general formula $ABO_3$ (in the formula, A represents at least one kind of metal element forming an A site, B represents at least one kind of metal element forming a B site, O represents an oxygen atom and the number of moles of elements of each of the A and B cites may deviate from 1.0 in the range where perovskite structure is held though the number of moles of elements of each of the A and B cites is 1.0 by standard.)

wherein the improvement comprises that the B site includes at least one kind of metal element B1 selected from an element group consisting of the IV group elements and at least one kind of metal element B2 selected from an element group consisting of the V and VI group elements, and at least a part of the metal element B2 is of the 0 to +4 valences.

The perovskite oxide in accordance with the present invention may have either a normal dielectricity or a ferroelectricity. Those having a ferroelectricity can be desirably used in a ferroelectric element such as a piezoelectric element or a ferroelectric memory (FRAM).

As the metal element B1, either a metal element of IVA group or a metal element of IVB group may be used. Taking into account the ferroelectric (piezoelectric) performance, the metal element B1 is preferably Zr and/or Ti which is of IVA group.

As the metal element B2, any metal element of VA group, VB group, VIA group and VIB group may be used. Taking into account the ferroelectric (piezoelectric) performance, the metal element B2 is preferably at least a metal element selected from the group consisting of V, Nb, Ta, Cr, Mo, and W.

When an element of V group is used as the metal element B2 in the perovskite oxide in accordance with the present invention, it is only necessary that at least a part thereof is of 0 to +4 valences and a +5 valence element may be or need not be included. Similarly, when an element of VI group is used as the metal element B2, it is only necessary that at least a part thereof is of 0 to +4 valences and a +5 or +6 valence element may be or need not be included.

In the B site, an element other than metal elements B1 and B2 described above may be included.

As the A site element, any of metal elements usable as the A site of the perovskite oxide may be employed. Taking into account the ferroelectric (piezoelectric) performance, the A site element is preferably at least a metal element selected from the group consisting of Pb, Ba, Sr, Ca, and Mg.

In accordance with the material design of the present invention, there can be provided a perovskite oxide which is suppressed in cation defect and excellent in ferroelectric (piezoelectric) performance.

Figure 1A:
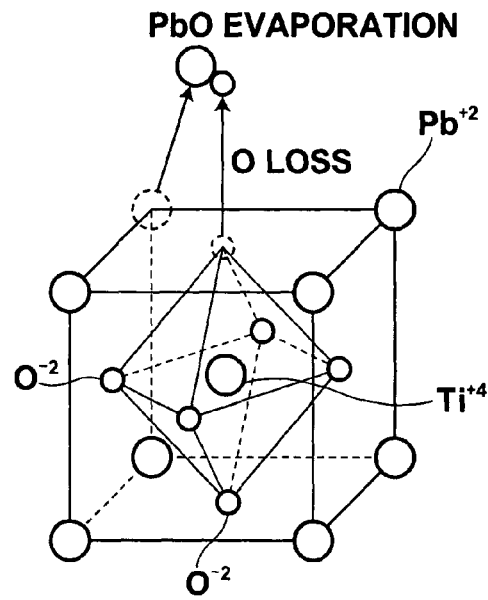
FIG. 1A is a perspective view showing a crystal lattice of an intrinsic PZT.

There has been known zircon lead titanate (PZT) where the A site is of Pb and the B site is of Zr and Ti as a piezoelectric material. In the perovskite oxide in accordance with the present invention, a compound comprising the PZT doped with the above-described metal element B2 is included. The reason why the cation defect is suppressed by the material design of the present invention in the PZT by way of example will be described, hereinbelow, in comparison with the prior art. FIG. 1A is a view showing a crystal lattice of an intrinsic PZT. Here in the intrinsic PZT, the B site is of Ti. As shown in FIG. 1A, in the crystal lattice, the valence of Pb in A site is +2 and the valences of Ti and O in B site are +4 and −2, respectively.

In the intrinsic PZT, the vapor pressure of Pb is high so that Pb in A site is apt to be vaporized to generate a defect in the A site. When Pb is dislocated from the A site, there has been known that oxygen loss is simultaneously generated on the basis of the law of charge neutrality (this defect is referred to as "Schottoky defect").

As described above, in U.S. Pat. No. 7,196,457, there is disclosed piezoelectric film having a composition represented by the following formula.

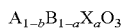

wherein A represents at least one kind of element including Pb, B represents Zr and/or Ti, X represents at least one kind of element of V, Nb, Ta, Cr, Mo and W, $0.05 \leq a \leq 0.3$, and $0.25 \leq b \leq 0.15$.

Figure 1B:
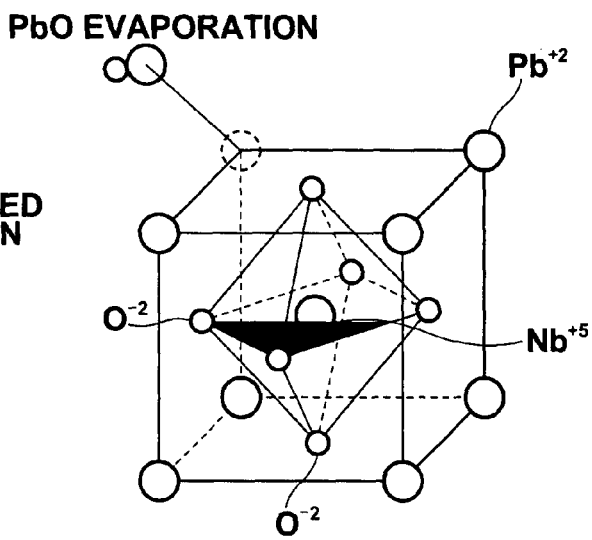
FIG. 1B is a perspective view showing a crystal lattice of a PZT where the B site thereof is substituted by +5 valence Nb.

In the invention disclosed in U.S. Pat. No. 7,196,457, B site is doped with +5- or +6-valence element. Further, as the +5- or +6-valence element, an element in the V- and/or VI-group element is employed. FIG. 1B shows a crystal lattice of a PZT where the B site thereof is substituted by +5 valence Nb.

In the above formula, the number of moles of the A site element is represented by "1-b", and "b" represents Pb loss. That is, the invention disclosed in U.S. Pat. No. 7,196,457, that Pb loss is generated is assumed and oxygen loss is suppressed from being generated simultaneously with generation of Pb loss by doping an element having a valence larger than +4 to the B site which is originally +4 in its valence. In this invention, it is conceivable that Pb in the A site connects oxygen in the air to form PbO and evaporates.

In the invention disclosed in U.S. Pat. No. 7,196,457, since the B site is doped with an element having a valence larger than +4, a cation defect in A site is necessarily generated taking account the law of charge neutrality. This is clear from the fact that the number of moles of the A site element is represented by "1-b" in the above formula (b" represents Pb loss).

In the invention disclosed in U.S. Pat. No. 7,196,457, piezoelectric film is formed in the sol/gel method. However, since the firing temperature is high in the sol/gel method, a V group element becomes of +5 in its valence where it is thermodynamically stable and a VI group element becomes of +6 in its valence where it is thermodynamically stable. In the fact, none of a V or VI group element which is 0 to +4 in its valence has been mentioned in U.S. Pat. No. 7,196,457.

Conventionally, there is no idea to positively dope a V or VI group element in a valence other than its intrinsic valence though a fine amount of a V group element which is intrinsically +5 in its valence or a VI group element which is intrinsically +6 in its valence is added in other valences by accident.

Figure 1C:
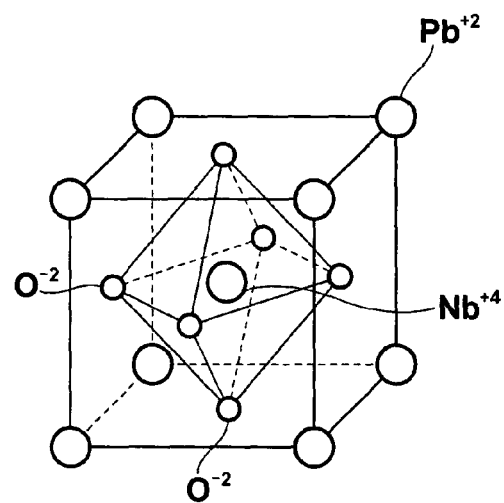
FIG. 1C is a perspective view showing a crystal lattice of a PZT where the B site thereof is substituted by +4 valences Nb.

In accordance with the present invention, the B site is doped with metal element B2 which is a V or VI group element and at least a part of the metal element B2 is of 0 to +4 in valence. FIG. 1C shows a crystal lattice of a PZT where Ti in the B site thereof is substituted by +4 valence Nb. As shown in FIG. 1C, it is conceivable that when the B site is doped with a +4 valence metal element B2, charge balance of the overall lattice is excellent and the cation defect in the A site and the oxygen defect are hard to be generated.

When the B site is doped with a metal element B2 which is from 0 to +3 in valence, since there simultaneously exists a metal element B2 larger than +4 in the valence (+5 when the metal element B2 is of the V group, +5 to 6 when the metal element B2 is of the VI group) and accordingly the charge neutrality is held on the whole, whereby also in this case, it is conceivable that the cation defect and the oxygen defect in the A site are hard to be generated. When there is no metal element B2 larger than +4 in the valence simultaneously exists with the metal element B2, it is conceivable that at least the oxygen defect in the A site are hard to be generated though it is conceivable on the basis of the law of charge neutrality that the oxygen defect is generated. Though it is preferred that the B site be +4 in valence on the whole, the B site may be somewhat deviated from +4 in valence on the whole.

These inventors have found that at least a part of the metal element B2 of V and/or VI group may be of the 0 to +4 valences by producing it in a low oxygen pressure non-equilibrium process in a gas phase growth method such as sputtering, pulse laser deposition method or plasma CVD.

As described above since the defect in the A site are hard to be generated in accordance with the material design, a perovskite oxide represented by the following general formula (1) can be provided.

$$A_{1+x}(B1_{1-y}B2_y)O_3 \qquad (1)$$

wherein A represents at least one kind of metal element forming an A site, B1 represents a B site element which is at least one kind of metal element selected from an element group consisting of the IV group elements, B2 represents a B site element which is at least one kind of metal element selected from an element group consisting of the V and VI group elements, O represents an oxygen atom, $0 \leq x$, and $0 < Y$.

In the invention disclosed in U.S. Pat. No. 7,196,457, the number of moles of the A site element is represented by "1-b", and is smaller than 1.0.

To the contrast, the number of moles of the A site element (1+x) can be larger than 1.0. These inventors have found that even a perovskite oxide where the weight of element of the A site is larger than a stoichiometric ratio can be obtained.

The upper limit of x is not limited. These inventors have found that a perovskite oxide which is excellent in ferroelectric (piezoelectric) performance or the like can be obtained when $0 \leq x \leq 0.3$.

Since being free of the A site defect as described above, it is preferred that $0 \leq x$. However, a perovskite oxide where x is negative in the general formula (1) is novel and is included in this invention.

It has been described previously that there is disclosed that, in "Effect of Nb doping on the microstructural and electrical properties of the PZT ceramics", M. Pereira et al., J. Eur. Ceram. Soc. Vol. 21, Issues 10-11, pp. 1353-1356, 2001, at most, about 7 mol % of Nb can be doped to PZT by solid solution in bulk ceramics. These inventors have found that, by doping the metal element B2 in a non-equilibrium process, more than 7 mol % of Nb can be doped to PZT. Accordingly, the upper limit of y is not limited. However, when the amount of doped metal element B2 is too large, precipitation of an oxide of the metal element B2 takes place and ferroelectric (piezoelectric) performance or the like can be deviated from the suitable range, whereby there is a fear that desired performance cannot be obtained. These inventors have found that, when $0 < Y \leq 3.0$, precipitation of an oxide of the metal element B2 does not take place and a perovskite oxide which is excellent in ferroelectric (piezoelectric) performance or the like can be obtained.

These inventors have found that in accordance with the material design of the present invention, a perovskite oxide which is more excellent in ferroelectric (piezoelectric) performance than the intrinsic PZT and that disclosed in U.S. Pat. No. 7,196,457 can be obtained. This will be described, hereinbelow.

It has been known that the piezoelectric constant e is generally represented by the following formula and is proportional to the effective charges Z* of the material. The effective charges Z* of the chief materials are shown in the following table 1. The following formula and table 1 are quoted from "L. Bellaiche and Vanderbilt, The American Physical Society, Vol. 83, 1347-1350(1999)".

TABLE 1

$$e_{33,j} = \sum_k \frac{ec}{\Omega} Z^*_{33}(k) \frac{du_3(k)}{d\eta_3}$$

| $Z^*_{33}$ | PT | PT | PZT | PMN-PT |
|---|---|---|---|---|
| Pb | 3.5 | (3.5) | 3.0 | 3.6 |
| Ti | 5.5 | (5.2) | 5.3 | 5.8 |
| Zr | — | — | 6.0 | — |
| Nb | — | — | — | 7.4 |
| Mg | — | — | — | 1.9 |
| $O_1$ | −2.2 | (−2.2) | −2.1 | −2.1 |
| $O_2$ | −4.6 | (−4.4) | −4.6 | −5.1 |

In table 1, there is shown that Z* increases in the order of Ti<Zr<Nb. An effective larger than intrinsic PZT can be obtained by substituting Ti and/or a part of Zr forming the B site of the intrinsic PZT by a V and VI group metal element B2 which is larger than the metal element in the effective charges Z*. The larger, the amount of doped metal element B2 is, the larger, the effective charges Z* is. As described above, a V and VI group metal element B2 can be doped to PZT in more than 7 mol % which has been taken as the upper limit of doping by solid solution in bulk ceramics, in accordance with the present invention.

It is conceivable that the effective charges Z* deteriorates and the piezoelectric constant e deteriorates when the cation defect is increased. It is conceivable that, in accordance with the present invention, since the cation defect is less apt to be generated as compared with the intrinsic PZT or the invention disclosed in U.S. Pat. No. 7,196,457, loss of the effective charges Z* due to the cation defect is reduced.

It is conceivable that, in accordance with the present invention, the above-said effects together provide a perovskite oxide which is more excellent in ferroelectric (piezoelectric) performance.

As described above, the present invention provides a novel concept of designing the a perovskite oxide which is suitable as a ferroelectric (piezoelectric) material or the like, and a perovskite oxide designed on the basis of the concept. In accordance with the present invention, the cation defect is less apt to be generated and a perovskite oxide which is more excellent in ferroelectric (piezoelectric) performance can be provided.

(Inorganic Composition)

Inorganic composition of the present invention is characterized by including the perovskite oxide in accordance with the present invention described above.

The inorganic composition of the present invention may contain various additives such as firing assistance, an arbitrary perovskite oxide other than the perovskite oxide of the present invention described above, or various other arbitrary components.

(Inorganic Molded Body/Inorganic Film)

Inorganic molded body of the present invention is characterized by including the perovskite oxide in accordance with the present invention described above and being molded in a predetermined shape.

Inorganic film of the present invention is characterized by including the perovskite oxide in accordance with the present invention described above.

The inorganic molded body/inorganic film may comprise only the perovskite oxide in accordance with the present invention described above (in this case, the inevitable impurities may be included.) or may contain arbitrary components similar to those in the inorganic composition of the present invention described above.

As the inorganic molded body of the present invention, bulk ceramics comprising the perovskite oxide in accordance with the present invention described above and arbitrary components if necessary may be included.

Since in the perovskite oxide in accordance with the present invention, the metal element B2 (a V or VI group element) at least a part of which is to be of 0 to 4 valences turns to of a thermodynamically stable valence (+5 valence in the case of a V group element, and +6 valence in the case of a VI group element) when it undergoes a high temperature firing step, it is preferred that the inorganic molded body of the present invention be produced not through a high temperature firing step. For example, the aerosol deposition (AD) method requires no high temperature firing step. Accordingly, the bulk ceramics containing the perovskite oxide in accordance with the present invention can be produced by carrying out the AD method by the use of the raw material including a V or VI group element of 0 to 4 valences.

The bulk ceramics including the perovskite oxide in accordance with the present invention can be produced by compression-molding the raw material powder comprising the components of the perovskite oxide in accordance with the present invention including a V and/or VI group element of 0 to 4 valences and arbitrary components if necessary and firing the obtained compression-molded body, when it can be fired at a relatively low temperature (a so-called bulk fired body).

It is preferred that the inorganic film be formed by a low oxygen pressure non-equilibrium process in a gas phase growth method such as sputtering, pulse laser deposition method or plasma CVD. By forming the film in such a way, at least a part of the metal element B2 may be stably of the 0 to +4 valences.

The inorganic film in accordance with the present invention can be formed also by AD method. In this case, by forming a film by the use of the raw material including a V or VI group element of 0 to 4 valences as in the production of the bulk ceramics described above, an inorganic film including the perovskite oxide in accordance with the present invention can be formed. In the AD method, the thickness of the film tends to increase as compared with the gas phase growth method. Accordingly, when the thickness of the formed film is to be small, it is preferred that the gas phase growth method be employed.

The perovskite oxide in accordance with the present invention includes those having a normal dielectricity and a ferroelectricity. Those having a ferroelectricity can be desirably used in a ferroelectric element such as a piezoelectric element or a ferroelectric memory (FRAM).

The inorganic molded body/inorganic film in accordance with the present invention may be either those having a crystalline orientation or those having no crystalline orientation.

When the inorganic molded body/inorganic film in accordance with the present invention is to be used as the piezoelectric material, it is preferred that the inorganic molded body/inorganic film in accordance with the present invention has a crystalline orientation.

As the piezoelectric strain, there can be shown, for instance, the following (1) to (4).

(1) Normal piezoelectric strain where it expands or contracts in the direction in which an electric field is applied in response to increase and reduction of the intensity of the electric field applied thereto when the vector components of the spontaneous polarization axis and the direction of application of the electric field conform to each other.

(2) Piezoelectric strain generated by a reversible 180° irrotation of the spontaneous polarization axis in response to increase and reduction of the intensity of the electric field applied.

(3) Piezoelectric strain where a phase transition of the crystal is caused in response to increase and reduction of the intensity of the electric field applied thereto and a volume change by the phase transition is used.

(4) Piezoelectric strain using an engineered domain effect where a larger strain can be obtained by using a material which is caused to the phase transition by application of an electric field and orienting the crystal so that the vector components of the spontaneous polarization axis after the phase transition and the direction of application of the electric field conform to each other. (in the case where the engineered domain effect is used, the piezoelectric element may be driven either under a condition of causing the phase transition or under a condition of not causing the phase transition)

(2) Piezoelectric strain using a reversible 180° irrotation of domain is disclosed, for instance, in Japanese Unexamined Patent Publication No. 2004-363557. (3) Piezoelectric strain using the phase transition is disclosed, for instance, in Japanese Patent Publication No. 3568107. (4) An engineered domain effect and piezoelectric strain using this are disclosed in "Ultrahigh strain and piezoelectric behavior in relaxor based ferroelectric single crystals", S. E. Park et. al., JAP, 82, 1804(1997) and Japanese Patent Application Nos. 2005-277108 and 2005-277109 which we have filed previously.

By using the piezoelectric strains (1) to (4) described above alone or in combination, a desired piezoelectric strain can be obtained. Further, in any one of the piezoelectric strains (1) to (4) described above, a larger piezoelectric strain can be obtained by orienting the crystal according to the principle of generating the strain.

For example, in the PZT system, there are three crystal systems, a cubic system, a tetragonal system and a rhombohedral system. Since the cubic system PZT is a normal dielectric body and does not exhibit a piezoelectricity, it is necessary so long as it is a PZT system crystal, that it should be the tetragonal system, the rhombohedral system or a mixture thereof. Since the spontaneous polarization axis is as follows, it is preferred that the crystalline orientation be designed taking into account the spontaneous polarization axis (in the case of the material which transits the phase, the spontaneous polarization axis after the phase transition) and the direction of application of the electric field, and the principle of generating the strain.

tetragonal system:<001>, rhombohedral system: <111>

The expression "having a crystalline orientation" means in this specification that the factor of orientation F as measured by Lotgerling method is not smaller than 80%.

The factor of orientation F is represented by the following formula (i).

$$F(\%)=(p-p_0)/(1-P_0)-100 \quad (i)$$

wherein P represents the ratio of a total of the reflective intensities from the orientating surface to a sum of the reflection intensities. In the case of (001) orientation, P represents the ratio ($\{\Sigma I(001)/\Sigma I(hkI)\}$) of the total $\Sigma I(001)$ of the reflective intensities I from the (001) surface to the total $\Sigma I(hkI)$ of the reflection intensities I(hk1) from the respective crystalline surfaces (hk1). For example, in the case of (001) orientation in the perovskite crystal, $$P=I(001)/[I(001)+I(100)+I(101)+I(110)+I(111)].$$

$P_0$ is P of the sample which is perfectly random in orientation. In the case where orientation is perfectly random ($p=P_0$), F=0%, and in the case where orientation is perfect (p=1), F=100%. (piezoelectric element (ferroelectric element), piezoelectric actuator and ink jet recording head)

Figure 2:
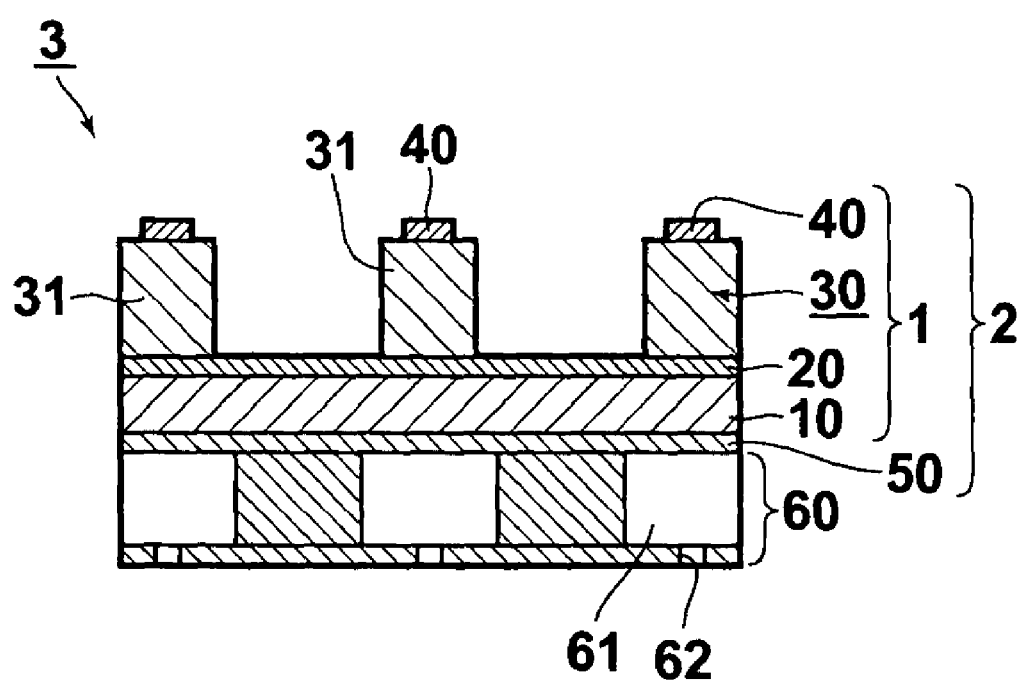
FIG. 2 is a cross-sectional view of a piezoelectric (ferroelectric) element in accordance with an embodiment of the present invention and a cross-sectional view of an important part of structure of an inkjet recording head (liquid discharge system) provided with the piezoelectric (ferroelectric) element.

Structure of the piezoelectric element (ferroelectric element) of the present invention, and the piezoelectric actuator and the ink jet recording head which are provided with the piezoelectric element will be described with reference to FIG. 2. FIG. 2 is a cross-sectional view of an important part of the ink jet recording head. For the purpose of easiness in viewing, the components are depicted in suitable scales different from the real scales.

The piezoelectric element (ferroelectric element) 1 of this embodiment comprises a lower electrode 20, piezoelectric film 30 and an upper electrode 40 superposed one on another on a substrate 10 in sequence. To the piezoelectric film 30, the electric field is applied in the direction of thickness by the lower and upper electrodes 20 and 40.

The lower electrode 20 is formed over substantially the entire area of the substrate 10, and on the lower electrode 20, is formed the piezoelectric film 30 in a pattern where the line protrusions 31 each of which extends from this side of FIG. 2 to the other side of the lower electrode 20 are oriented, and the upper electrode 40 is formed on the protrusions 31. A close contact layer formed of Ti or the like may be interposed between the substrate 10 and the lower electrode 20 to increase the close contact therebetween.

The pattern of the piezoelectric film 30 need not be limited to the illustrated pattern but may be suitably designed. The piezoelectric film 30 may be continuous. However, it is preferred that the piezoelectric film 30 be formed in a pattern of a plurality of the separate protrusions 31 so that expansion and contraction of each protrusion take place smoothly and a larger displacement can be obtained.

The substrate 10 may be basically formed of any material such as silicon, glass, stainless steel (SUS), yttrium-stabilized zirconia (YSZ), alumina, sapphire, silicon carbide, and the like. The substrate 10 may comprise a laminated circuit board such as an SOI board where $SiO_2$ film and an Si active layer are superposed in sequence on a silicon substrate.

The main component of the lower electrode 20 may basically comprises any material such as metal and metal oxide like Au, Pt, Ir, $IRO_2$, $RuO_2$, $LaNiO_3$ and $SrRuO_3$ and combinations thereof.

The main component of the upper electrode 40 may basically comprises any material such as electrode materials generally used in a semiconductor process like materials shown by way of example in the lower electrode 20, Al, Ta, Cr and Cu and combinations thereof.

The thickness of the lower electrode 20 and the upper electrode 40 basically need not be limited, and preferably 50 to 500 nm.

The piezoelectric film 30 is piezoelectric film comprising the perovskite oxide in accordance with the present invention (the inevitable impurities may be included). The thickness of the piezoelectric film 30 basically need not be limited, and, for instance, 1 to 10 μm. Though the piezoelectric film 30 may be either those having a crystalline orientation or those having no crystalline orientation, it is preferred when taking into account the piezoelectric performance that the piezoelectric film 30 has a crystalline orientation.

The piezoelectric actuator 2 comprises a vibrating plate 50 which vibrates according to expansion and contraction of the piezoelectric film 30 and is mounted on the lower surface of the substrate 10 of the piezoelectric element 1.

The ink jet recording head (liquid discharge system) 3 substantially comprises an ink nozzle (ink storing/discharging member) 60 which is provided with an ink chamber 61 for storing therein ink and an ink discharge port 62 through which ink is externally discharged from the ink chamber 61 and is mounted on the lower surface of the piezoelectric actuator 2. The ink chamber 61 is provided in a plurality corresponding to the number and the pattern of the protrusion 31 of the piezoelectric film 30.

Instead of mounting the vibrating plate 50 and the ink nozzle 60 which are separate from the substrate 10, a part of the substrate 10 may be processed into the vibrating plate 50 and the ink nozzle 60. For example, when the substrate 10 comprises a laminated circuit board such as an SOI board, the ink chamber 61 is formed by etching the substrate 10 from the lower surface thereof, and the vibrating plate 50 and the ink nozzle 60 are formed by processing the substrate 10 itself.

The piezoelectric element 1, the piezoelectric actuator 2 and the ink jet recording head 3 of this embodiment are structured as described above.

(Ink Jet Recording System)

Figure 3:
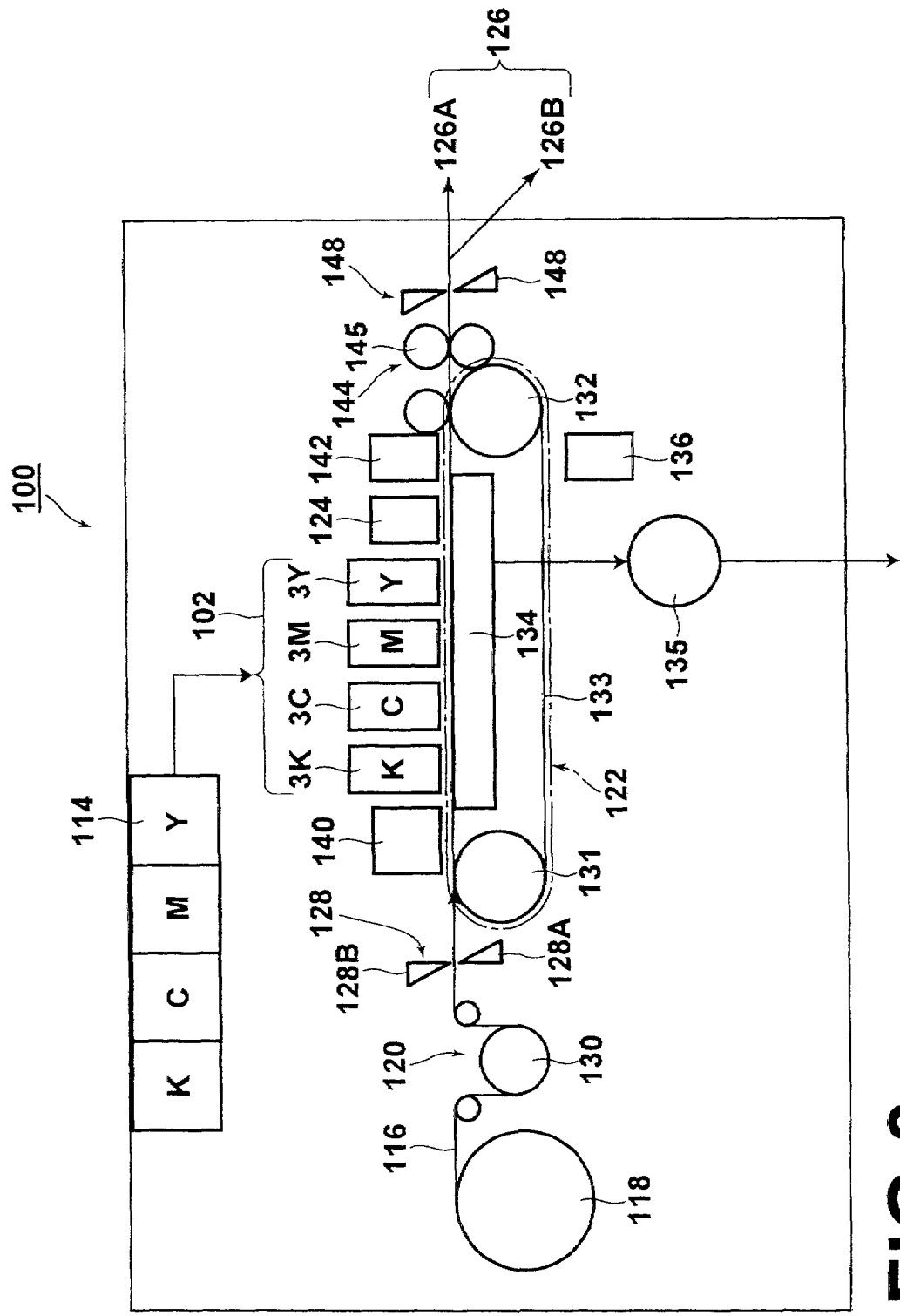
FIG. 3 is a block diagram showing an example of an ink jet recording system provided with an ink jet recording head shown in FIG. 2.

An example of an ink jet recording system provided with an ink jet recording head 3 of the embodiment described above will be described with reference to FIGS. 3 and 4. FIG. 3 is a block diagram showing the overall ink jet recording system, and FIG. 4 is a block diagram showing a part of the ink jet recording system.

The ink jet recording system 100 of this embodiment comprises a printing portion 102 having ink jet recording heads 3K, 3C, 3M and 3Y provided for each color of ink, an ink storing/loading portion 114 for storing ink to be supplied to heads 3K, 3C, 3M and 3Y, a paper supply portion 118 for supplying recording papers 116, a decurl portion 120 which removes the curl from the recording papers 116, a suction belt transfer portion 122 which is opposed to a nozzle surface (through which the ink is discharged) of the printing portion 102 and transfers the recording paper 116 while holding the flatness of the recording paper 116, a print detecting portion 124 which detects result of printing by the printing portion 102 and a paper discharge portion 126 which externally discharges printed recording paper (printings), Each of the heads 3K, 3C, 3M and 3Y forming the printing portion 102 is an ink jet recording head 3 of the above embodiment.

In the decurl portion 120, heat is applied by the heating drum 130 to the recording paper 116 in the direction reverse to the direction in which the recording paper 116 tends to curl, and the recording paper 116 is decurled.

In the system using a rolled paper, a cutter 128 is provided in the stage behind the decurl portion 120 to cut the rolled paper into a desired size. The cutter 128 comprises a stationary blade 128A having a length not shorter than the width of the transfer path of the recording paper 116 and a circular blade 128B which moves along the stationary blade 128A, and the stationary blade 128A is applied to the back side of the recording paper 116 and the circular blade 128B is opposed to the stationary blade 128A with the transfer path of the recording paper 116 intervening therebetween. In the system using cut papers, the cutter 128 is unnecessary.

The decurled and cut recording paper 116 is fed to the suction belt transfer portion 122. The suction belt transfer portion 122 comprises a pair of rollers 131 and 132 and an endless belt 133 passed around the rollers 131 and 132, and at least a part thereof opposed to the nozzle surface and a sensor surface of the print detecting portion 124 of the printing portion 102 is flat.

The belt 133 has a width larger than the width of the recording paper 116 and a number of suction holes (not shown) are formed in the surface of the belt 133. A suction chamber 134 is provided in a position opposed to the nozzle surface and a sensor surface of the print detecting portion 124 of the printing portion 102 inside the belt 133 passed around the rollers 131 and 132, and the recording paper 116 is suctioned and held against the belt 133 by sucking the suction chamber 134 to a negative pressure by a fan 135.

When driving force of a motor (not shown) is transmitted to at least one of the rollers 131 and 132 around which the belt 133 is passed, the belt 133 is driven in the clockwise direction in FIG. 3 and the recording paper 116 held on the belt 133 is transferred from the left to the right in FIG. 3.

When edgeless prints or the like are printed, ink adheres to the belt 133. Accordingly, a belt cleaning portion 136 is provided to be opposed to the outer side of the belt 133 in a predetermined position (a suitable position outside the printing area).

On the transfer path of the recording paper 116 formed by the suction belt transfer portion 122, a heating fan 140 is provided upstream of the printing portion 102. The heating fan 140 blows heated air to the recording paper 116 before printing to heat the recording paper 116. When the recording paper 116 is heated immediately before printing, ink is apt to be dried after adhering to the recording paper 116.

The ink jet recording system 100 of this embodiment has a so-called full-line type head where the printing portion 102 forms a line type head with a length corresponding to a maximum paper width which is disposed in perpendicular to the paper-feed direction. (See FIG. 4) Each of the heads 3K, 3C, 3M and 3Y is formed by a line type head where a plurality of ink discharge ports (nozzle) are arranged over a length exceeding at least one side of a maximum recording paper 116 that is an object of the ink jet recording system 100.

Along the transfer path of the recording paper 116, the heads 3K, 3C, 3M and 3Y corresponding to the inks which are black (K), cyan (C) magenta (M) and yellow (Y) in color are disposed in this order from the upstream. A color image is recorded on the recording paper 116 by discharging the ink from the respective heads 3K, 3C, 3M and 3Y while transferring the recording paper 116.

The print detecting portion 124 comprises a line sensor or the like for taking an image of a result of droplet-shooting by the printing portion 102, and detects a discharge defect such as clogging in the nozzle from a droplet-shooting image read by the line sensor.

Behind the print detecting portion 124, is provided an after drying portion 142 which comprises a heating fan or the like for drying the printed image. Since contact with the printed surface before the ink after printing is dried is preferably avoided, the system where heated air is blown is preferable.

Behind the after drying portion 142, is provided an heating/pressing portion 144 for controlling the glossiness of the image surface. In the heating/pressing portion 144, surface irregularities are transferred to the image surface by pressing the image surface with pressing rollers 145 having predetermined surface irregularities on their surfaces while heating the image surface.

The printings thus obtained are discharged by the paper discharge portion 126. Originally, it is preferred that the running image (image obtained by printing a target image) to be printed be discharged separately from the test printings. In the ink jet recording system 100 of this embodiment, a selecting means (not shown) is provided to separate the running image and the test printings and switches running paths and to feed the running image and the test printings to the respective paper discharge portions 126A and 126B.

When the running image and the test printings are simultaneously printed in parallel, a cutter 148 is provided to sever the test printings.

The ink jet recording system 100 of this embodiment is arranged as described above.

EXAMPLES

Embodiments of the present invention and comparative examples will be described, hereinbelow.

Embodiment 1

A substrate comprising a Si substrate and a thermal oxide film layer formed thereon was prepared. A Ti close contact layer 20 nm thick and a Pt lower electrode 200 nm thick were formed on the substrate under the condition where the temperature of the substrate was 200° C. by the use of sputtering system.

Then piezoelectric film 5 mµ thick was formed substantially over the entire area of the substrate on which the lower electrode had been formed under the condition where the temperature of the substrate was 525° C. in a mixed atmosphere of $Ar/O_2$ where the volume fraction of $O_2$ was 3.0% and the degree of vacuum was 0.5 Pa by the same system by the use of a $Pb_{1.3}(Zr_{0.52}Ti_{0.48})_{0.9}Nb_{0.1}O_3$ target.

Pt upper electrode film 100 nm thick was finally formed on the above piezoelectric film by the same system, and a piezoelectric element of the present invention was obtained.

(Evaluation)

(Analysis of the Composition of the Piezoelectric Film)

At the time when formation of the piezoelectric film was ended, analysis of the composition of the piezoelectric film was carried out by an XRF. Composition of the piezoelectric film was $Pb_{1.1}(Zr_{0.52}Ti_{0.48})_{0.9}Nb_{0.1}O_3$. The amount of doped Nb was 10 mole % and higher than about 7% which was said to be a limit to be solid-solved in bulk ceramics. Further, the amount of A site element is larger than the stoichiometric ratio and the composition was free from the A site defect.

(Analysis of the Number of Valences of Nb)

At the time when formation of the piezoelectric film was ended, analysis of the number of valences of Nb in the piezoelectric film was carried out by an XANES. FIG. 5 shows the result of analysis together with the spectra of a standard sample. In FIG. 5, the composition of the piezoelectric film was indicated at Nb-PZT.

For the purpose of comparison, analysis of the number of valences of Nb in the piezoelectric film was carried out in the same manner for the conventional Nb-PZT bulk fired body. Obtained spectra were shown in FIG. 5. Since the firing temperature is high in the bulk fired body, all the Nb existed in +5 in its valence where it was thermodynamically stable. It is conceivable that result is the same in the sol/gel method where the firing temperature is also high.

To the contrast, in the piezoelectric film formed in accordance with this embodiment, though almost all the Nb existed in +5 in its valence, a part of them existed in +4 in its valence (the amount of Nb existed in 0 or +2 in its valence was at a noise level). Though Nb in the target was +5, since the piezoelectric film was formed in a non-equilibrium process in this embodiment, a part of Nb could be doped in +4.

(XRD Analysis)

At the time when formation of the piezoelectric film was ended, XRD analysis of the piezoelectric film was carried.

The obtained piezoelectric film was of a mixture of tetragonal systems and rhombohedral systems, and had a 100/001 orientation.

(Piezoelectric Constant)

A piezoelectric constant of the obtained piezoelectric element was measured by the use of the cantilever. The piezoelectric constant $d_{31}$ was 250 pm/V.

Comparative Examples

Production and evaluation of piezoelectric element were carried out in the same manner as those in the embodiment 1 except that a $Pb_{1.3}(Zr_{0.52}Ti_{0.48})O_3$ target was used.

Composition of the piezoelectric film was $Pb_{1.0}(Zr_{0.52}Ti_{0.48})O_3$ and the piezoelectric constant $d_{31}$ was 180 pm/V.

(Comparison of the Piezoelectric Constants)

In Nb-PZT disclosed in U.S. Pat. No. 7,196,457 (it is conceivable that it has a number of valence the same as that of the conventional Nb-PZT bulk fired body. See, the result of the above XANES analysis) where only +5 Nb exists, only 200 pm/V (=−200 pC/N) is disclosed as the measured piezoelectric constant ($d_{31}$). In U.S. Pat. No. 7,196,457, the composition of the actually measured piezoelectric film is $Pb_{1-b}(Zr_{1-p}Ti_p)_{1-a}Nb_aO_3$(a=0.20, b=0.10, p=0.44).

When this data is compared with data on the embodiment 1 and the comparative example 1, it has been found that a piezoelectric constant higher than the intrinsic PZT (the comparative example 1) can be obtained in Nb-PZT disclosed in U.S. Pat. No. 7,196,457 and a higher piezoelectric constant is obtained in Nb-PZT of the present embodiment where +4 Nb exists than in Nb-PZT disclosed in U.S. Pat. No. 7,196,457 where only +5 Nb exists.

The perovskite oxide of the present invention can be desirably used in piezoelectric actuators to be mounted on, for instance, ink jet recording heads, magnetic recording/reproducing heads, MEMS (micro electro-mechanical systems), micro pumps or ultrasonic probes, and in ferroelectric memories (FRAM).

What is claimed is:

1. A perovskite oxide represented by a general formula $ABO_3$,
   wherein A represents at least one kind of metal element forming an A site,
   B represents at least one kind of metal element forming a B site,
   O represents an oxygen atom and the number of moles of elements of each of the A and B cites may deviate from 1.0 in the range where perovskite structure is held though the number of moles of elements of each of the A and B sites is 1.0 by standard,
   wherein the improvement comprises that the B site includes at least one kind of metal element B1 selected from an element group consisting of the IV group elements and at least one kind of metal element B2 selected from an element group consisting of the V and VI group elements, and at least a part of the metal element B2 is of the 0 to +4 valence.

2. The perovskite oxide as defined in claim 1 in which the metal element B1 is Zr and/or Ti.

3. The perovskite oxide as defined in claim 1 in which the metal element B2 is at least a metal element selected from the group consisting of V, Nb, Ta, Cr, Mo, and W.

4. The perovskite oxide as defined in claim 1 in which the A site element is at least a metal element selected from the group consisting of Pb, Ba, Sr, Ca, and Mg.

5. The perovskite oxide as defined in claim 1 characterized by represented by the following general formula (1):

$$A_{1+x}(B1_{1-y}B2_y)O_3 \qquad (1)$$

wherein A represents at least one kind of metal element forming an A site,

B1 represents a B site element which is at least one kind of metal element selected from an element group consisting of the IV group elements, B2 represents a B site element which is at least one kind of metal element selected from an element group consisting of the V and VI group elements, O represents an oxygen atom, $1 \leq 1+x$ with respect to the suffix $1+x$ of A;

$1-y < 1$ with respect to the suffix $1-y$ of B1; and $0 < y$ with respect to the suffix y of B2.

6. The perovskite oxide as defined in claim 5 in which $1 \leq 1+x \leq 3$ with respect to the suffix $1+x$ of A;

$0.7 \leq 1-y < 1$ with respect to the suffix $1-y$ of B1; and $0 < y \leq 0.3$ with respect to the suffix y of B2.

7. The perovskite oxide as defined in claim 1, said perovskite oxide has a ferroelectric electricity.

8. An inorganic composition containing therein the perovskite oxide defined in claim 1.

9. An inorganic composition containing therein the perovskite oxide defined in claim 1 and molded in a predetermined shape.

10. An inorganic film containing therein the perovskite oxide defined in claim 1.

11. The inorganic film as defined in claim 10 having a crystalline orientation.

12. The inorganic film as defined in claim 10 formed by any one of sputtering, pulse laser deposition and plasma CVD.

13. A ferroelectric element comprising ferroelectric film including therein the perovskite oxide defined in claim 7 and an electrode for applying an electric field to the ferroelectric film.

14. A piezoelectric actuator comprising ferroelectric film including therein the perovskite oxide defined in claim 7, an electrode for applying an electric field to the ferroelectric film and a vibrating plate which vibrates according to expansion and contraction of the piezoelectric film.

15. A liquid discharge system comprising
the piezoelectric actuator defined in claim 14 and
a liquid storing/discharging member having a liquid storing chamber in which liquid is stored and a liquid discharge port through which the liquid is externally discharged from the liquid storing chamber.

* * * * *